(12) United States Patent
Lee et al.

(10) Patent No.: US 10,326,449 B2
(45) Date of Patent: Jun. 18, 2019

(54) LEVEL CONVERTER CIRCUITRY

(71) Applicant: The Regents of the University of Michigan, Ann Arbor, MI (US)

(72) Inventors: Jeongsup Lee, Ann Arbor, MI (US); Mehdi Saligane, Ann Arbor, MI (US); David Theodore Blaauw, Ann Arbor, MI (US); Dennis Michael Chen Sylvester, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/727,382

(22) Filed: Oct. 6, 2017

(65) Prior Publication Data

US 2019/0109588 A1    Apr. 11, 2019

(51) Int. Cl.
*H03K 19/0175*    (2006.01)
*H03K 19/0185*    (2006.01)

(52) U.S. Cl.
CPC ........... *H03K 19/017509* (2013.01); *H03K 19/01855* (2013.01); *H03K 19/018514* (2013.01); *H03K 19/018528* (2013.01)

(58) Field of Classification Search
CPC ....... H03K 19/0175; H03K 19/017509; H03K 19/0185; H03K 19/018507; H03K 19/018514; H03K 19/018521; H03K 19/018528; H03K 19/01855
USPC ................................ 326/63, 80, 81; 327/333
See application file for complete search history.

(56) References Cited

U.S. PATENT DOCUMENTS

| 4,663,701 A | * | 5/1987 | Stotts | A61N 1/362 327/333 |
| 2005/0243614 A1 | * | 11/2005 | Kang | G11C 7/1051 365/189.05 |
| 2012/0268182 A1 | * | 10/2012 | Lee | H03K 3/356121 327/199 |

(Continued)

OTHER PUBLICATIONS

Myers, et al; "An 80nW Retention 11.7pJ/Cycle Active Subthreshold ARM Cortex-M0+ Subsystem in 65nm CMOS for WSN Applications"; ISSCC 2015, Session 8, Low-Power Digital Techniques; Feb. 24, 2015.

(Continued)

*Primary Examiner* — William Hernandez
(74) *Attorney, Agent, or Firm* — Pramudji Law Group PLLC; Ari Pramudji

(57) ABSTRACT

Various implementations described herein are directed to an integrated circuit. The integrated circuit may include clock circuitry having a first plurality of logic components arranged to receive a low voltage supply, a data input signal and a clock input signal and to provide a first plurality of intermediate signals and multiple intermediate clock signals. The integrated circuit may include level converter core circuitry having voltage biasing circuitry and voltage control circuitry arranged to receive a high voltage supply, the first plurality of intermediate signals and the multiple intermediate clock signals and to provide a second plurality of intermediate signals. The integrated circuit may include latch circuitry having a second plurality of logic components arranged to receive the high voltage supply, the low voltage supply and the second plurality of intermediate signals and to provide a data output signal.

10 Claims, 5 Drawing Sheets

(56) References Cited

U.S. PATENT DOCUMENTS

| | | | | |
|---|---|---|---|---|
| 2012/0268187 A1* | 10/2012 | Kimoto | ............ | H03K 3/356069 |
| | | | | 327/328 |
| 2014/0253202 A1* | 9/2014 | Chen | ...................... | H03K 3/011 |
| | | | | 327/292 |
| 2015/0381180 A1* | 12/2015 | Tsuji | .............. | H03K 19/018521 |
| | | | | 327/319 |

OTHER PUBLICATIONS

Zhou, et al.; "A Fast and Energy-Efficient Level Shifter with Wide Shifting Range from Sub-threshold up to I/O Voltage"; Proc. IEEE Asian Solid-State Circuits Conf. (A-SSCC), pp. 137-140; 2013.

Osaki, et al.; "A Low-Power Level Shifter With Logic Error Correction for Extremely Low-Voltage Digital CMOS LSIs"; IEEE Journal of Solid Sate Circuits; vol. 47, No. 07; Jul. 2012.

Kim, et al.; "LC2: Limited Contention Level Converter for Robust Wide-Range Voltage Conversion"; Symp. VLSI Circuits Dig. Tech. Papers; pp. 188-189; 2011.

Ishihara, et al.; "Level Conversion for Dual-Supply Systems"; IEEE Transactions on VLSI Systems; vol. 12, No. 2; Feb. 2004.

Montanaro, et al.; "A 160-MHz, 32-b, 0.5-W CMOS RISC Microprocessor"; IEEE Journal of Solid Sate Circuits; vol. 31, No. 11; Nov. 1996.

\* cited by examiner

500

510 — fabricating clock circuitry having a first plurality of logic components arranged to receive a low voltage supply, a data input signal and a clock input signal and provide a first plurality of intermediate signals and multiple intermediate clock signals based on the low voltage supply, the data input signal and the clock input signal 520 — fabricating level converter core circuitry having voltage biasing circuitry and voltage control circuitry arranged to receive a high voltage supply, the first plurality of intermediate signals and the multiple intermediate clock signals and provide a second plurality of intermediate signals based on the high voltage supply, the first plurality of intermediate signals and the multiple intermediate clock signals 530 — fabricating latch circuitry having a second plurality of logic components arranged to receive the high voltage supply, the low voltage supply and the second plurality of intermediate signals and provide a data output signal based on the high voltage supply, the low voltage supply and the second plurality of intermediate signals

FIG. 5

LEVEL CONVERTER CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Modern ultra-low power (ULP) circuits typically employ sub-threshold or near-threshold design techniques but also require higher voltage domains for RF, I/O, and other circuits. As a result, wide-range level conversion is needed to interface between various blocks in ULP circuits. Generally, conventional level converter (LC) designs that operate at sub-threshold or near-threshold voltage is difficult to implement. As such, conventional LC designs suffer from severe contention between strong pull-up devices and weak pull-down devices, which unfortunately leads to high sensitivity to delay and power.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 5 illustrates a process diagram of a method for fabricating level converter circuitry in accordance with implementations described herein.

DETAILED DESCRIPTION

Various implementations described herein refer to and are directed to schemes and techniques for implementing level converter circuitry, such as, e.g., a leakage-biased synchronous level converter. For instance, the schemes and techniques described herein may be utilized for implementing a robust synchronous wide-range clocked level converter (LC) for ultra-low power (ULP) system-on-a-chip (SoC) circuitry. By biasing circuitry using NMOS leakage current, the schemes and techniques described herein provide for robust operation across a wide range of low and high voltage supplies, as well as PVT (process, voltage and temperature) variations. One advantage may include consuming much less switching power than the others, and another advantage may include supporting a flexible conversion range with robustness across PVT variations, such as, e.g., supporting any combinations of sub-threshold, near-threshold, and I/O voltages, including voltage ranges between 0.3V to 1.8/2.5/3.3V and 0.4V to 1.8/2.5/3.3V.

Various implementations for providing level converter circuitry with bypass control will now be described with reference to FIGS. 1-5.

Figure 1:
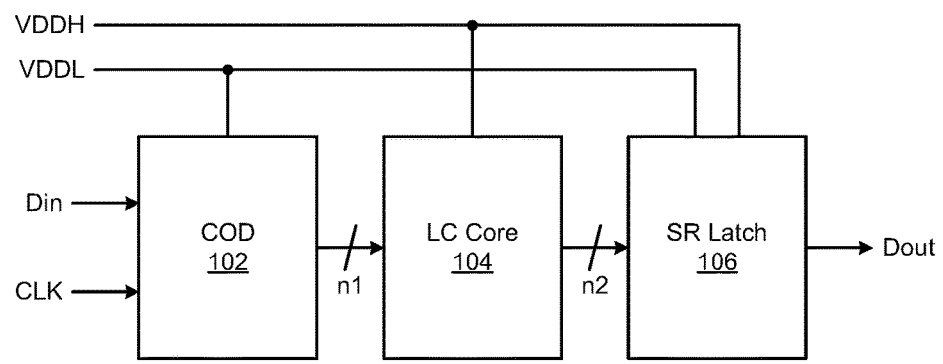
FIG. 1 illustrates a block diagram of level converter circuitry in accordance with implementations described herein.

FIG. 1 illustrates a diagram of level converter circuitry 100 in accordance with implementations described herein. The level converter circuitry 100 may include various associated circuitry, such as, e.g., clock circuitry 102, level converter (LC) core circuitry 104, and latch circuitry 106 that may be implemented as an integrated circuit (IC) in various types of memory applications, such as, e.g., random access memory (RAM), and/or any other types of memory, including any type of volatile and non-volatile memory. In some cases, the clock circuitry 102 may be implemented as clock-on-demand (COD) circuitry, and the latch circuitry 106 may be implemented as set-reset (SR) latch circuitry. In various cases, the level converter circuitry 100 may be integrated with various types of computing circuitry and/or various related components on a single chip. Further, the level converter circuitry 100 may be implemented in an embedded system for various electronic and/or mobile applications, including system-on-a-chip (SoC) applications.

As described in more detail herein below, in reference to FIGS. 2-4, the level converter circuitry 100 may include and may be implemented with multiple metal-oxide-semiconductor (MOS) transistors including multiple thick oxide P-type MOS (PMOS) transistors, multiple thick oxide N-type MOS (NMOS) transistors (e.g., thick oxide NMOS transistors may be provided in one or more NAND gates of the SR latch circuit 106), multiple thick oxide native N-type MOS (NMOS) transistors, multiple thin oxide PMOS transistors (e.g., thin oxide PMOS transistors may be provided in one or more logic gates of the COD circuit 102, and multiple thin oxide NMOS transistors.

In various implementations, the level converter circuitry 100 may operate in multiple voltage domains, such as, e.g., a low voltage supply VDDL and a high voltage supply VDDH. For instance, the clock circuitry 102 may operate in a first voltage domain, such as, e.g., VDDL, the LC core circuitry 104 may operate in multiple voltage domains, such as, e.g., VDDL and VDDH, and the latch circuitry 106 may operate in a second voltage domain, such as, e.g., VDDH. Further, the data output signal Dout from the level converter circuitry 100 may be in the second voltage domain VDDH. In some scenarios, although the LC core circuit 104 may not use VDDL as an input, its input signals n1 may be in the VDDL domain; thus, the LC core circuit 104 may operate in the multiple voltage domains, such as, e.g., VDDL and VDDH. In some other scenarios, although the SR latch circuit 106 may receive VDDL as an input, it may be used for biasing one or more devices or components provided therein, such as, e.g., one or more transistors M15 and M16, as shown in FIG. 4. Further, in reference to the SR latch circuit 106, one or more or all of input signals n2 and/or output signal Dout may be in the VDDH domain.

As shown in FIG. 1, the clock circuitry 102 may receive the low voltage supply VDDL, a data input signal Din, and a clock input signal CLK and provide a first plurality of intermediate signals and multiple intermediate clock signals n1 (e.g., 5) based on the low voltage supply VDDL, the data input signal Din, and the clock input signal CLK. In some cases, the clock circuitry 102 may be implemented as clock-on-demand (COD) circuitry, wherein the clock and pulse signals may be generated with more energy efficiency.

In some implementations, the clock circuitry 102 may be implemented with a plurality of logic components, such as, e.g., various logics gates and D-latches or D-flip-flops (DFFs). Generally, a DFF is a positive edge (posedge)

triggered storage device. Internally, some DFFs may be provided with a ph2 D-latch (e.g., latch is open, when the clock is low) and a ph1 D-latch (e.g., latch is open, when the clock is high). The output Q of the DFF may serve as a scan output (SO) signal. In some cases, the clock circuitry 102 may be configured as a MUX-DFF type scan cell having one or more multiplexers (MUXs), ph2 D-latches, and ph1 D-latches. The clock circuitry 102 will be described in more detail in the paragraphs below with reference to FIG. 2.

As shown in FIG. 1, the level converter (LC) core circuitry 104 may receive a high voltage supply VDDH and multiple intermediate signals n1 (e.g., 5 signals including a first plurality of intermediate signals and multiple intermediate clock signals) and provide a second plurality of intermediate signals n2 (e.g., 2 signals) based on the high voltage supply VDDH and the multiple intermediate signals n1.

In some implementations, the LC core circuitry 104 may be implemented with various associated circuitry, such as, e.g., voltage biasing circuitry, voltage control circuitry, and voltage output circuitry with each having multiple transistors arranged for various operations. For instance, the voltage biasing circuitry may be used to implement a current mirror having multiple transistors arranged to receive the high voltage supply VDDH and provide a biasing voltage V_BIAS based on leakage current from at least one of the multiple transistors. In another instance, the voltage control circuitry may include a pair of cross-coupled transistors and a corresponding pair of coupling capacitors arranged to receive the biasing voltage V_BIAS from the current mirror and provide a control voltage V_CTRL based on the biasing voltage V_BIAS to control a pair of pre-charge transistors that are coupled to another pair of cross-coupled transistors. Further, in another instance, the voltage output circuitry may include multiple transistors arranged to receive the high voltage supply VDDH and provide voltage output signals OUTA, OUTB based on the voltage control signal V_CTRL along with multiple activation signals. The LC core circuitry 104 will be described in more detail in the paragraphs below with reference to FIG. 3.

As shown in FIG. 1, the latch circuitry 106 may receive the high voltage supply VDDH, the low voltage supply VDDL, and the second plurality of intermediate signals n2 and provide a data output signal Dout based on the high voltage supply VDDH, the low voltage supply VDDL, and the second plurality of intermediate signals n2. In some cases, the latch circuitry 106 may be implemented as set-reset (SR) latch circuitry.

In some implementations, the latch circuitry 106 may include a plurality of logic components, such as, e.g., multiple logic gates and multiple transistors, arranged to receive the high voltage supply VDDH, the low voltage supply VDDL, and the second plurality of intermediate signals n2 so as to provide the data output signal Dout based on the high voltage supply VDDH, the low voltage supply VDDL, and the second plurality of intermediate signals n2. As shown and described herein below, the second plurality of intermediate signals n2 may include the voltage output signals OUTA, OUTB that is provided by the LC core circuitry 104. The latch circuitry 106 will be described in more detail in the paragraphs below with reference to FIG. 4.

Figure 2:
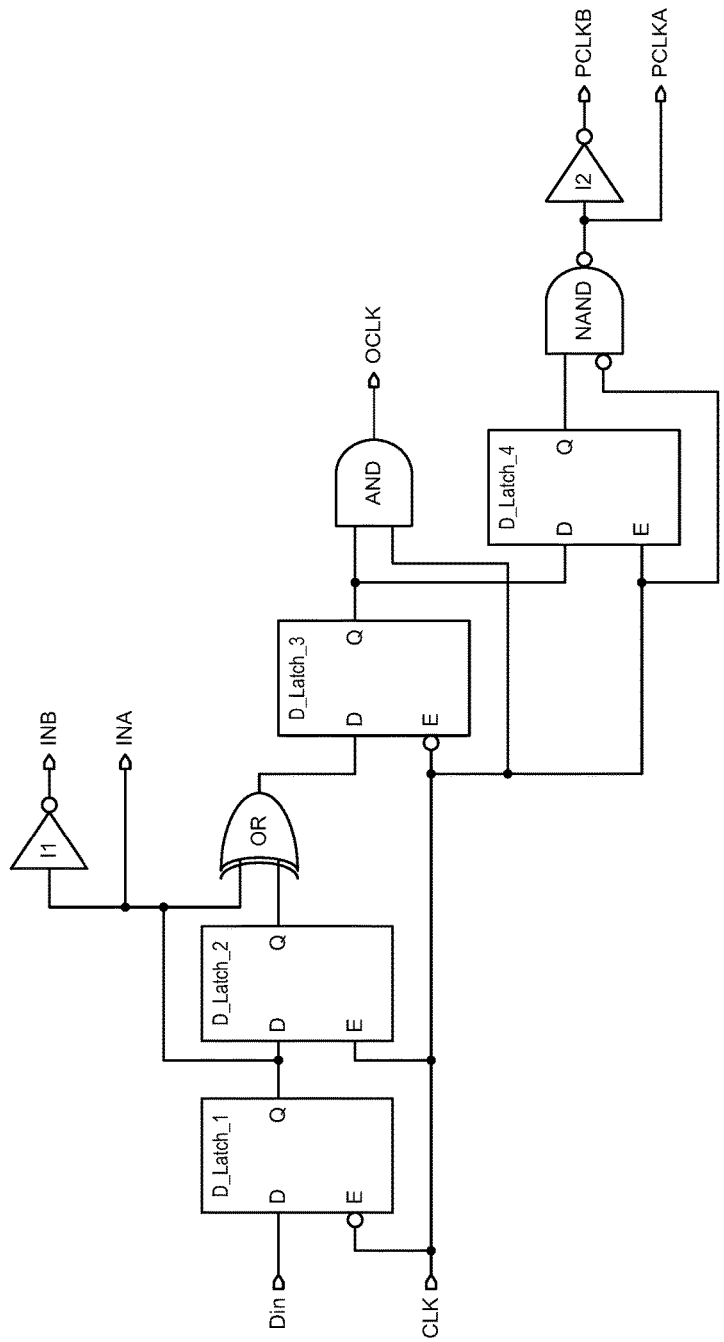
FIG. 2 illustrates a schematic diagram of level converter (LC) core circuitry in accordance with implementations described herein.

FIG. 2 illustrates a schematic diagram of the clock circuitry 102 in accordance with implementations described herein. The clock circuitry 102 in FIG. 2 provides one example schematic implementation of the clock circuitry (COD) block 102 of FIG. 1.

As shown in FIG. 2, the clock circuitry 102 may include a first plurality of logic components arranged to receive the low voltage supply VDDL, the data input signal Din, and the clock input signal CLK and provide a first plurality of intermediate signals INA, INB and multiple intermediate clock signals OCLK, PCLKA, PCLKB based on the low voltage supply VDDL, the data input signal Din, and the clock input signal CLK.

In some instances, the clock circuitry 102 may be implemented as clock-on-demand (COD) circuitry, and the first plurality of logic components may include multiple data latches (e.g., D_latch_1, D_latch_2, D_latch_3, D_latch_4) and multiple logic gates (e.g., NOT gates or Inverters I1, I2, OR gate, AND gate, NAND gate). In some scenarios, the first plurality of logic components may be arranged to receive the low voltage supply VDDL, the data input signal Din, and the clock input signal CLK and provide multiple activation signals, such as, e.g., the first plurality of intermediate signals INA, INB and the multiple intermediate clock signals OCLK, PCLKA, PCLKB, based on the low voltage supply VDDL, the data input signal Din, and the clock input signal CLK.

In reference to the arrangement and configuration of the COD circuitry 102, the D_latch_1 receives the data input signal Din and provides an output Q signal based on the clock input signal CLK that is received at an inverted enable input E. The output Q signal from the D_latch_1 also provides the intermediate signal INA and a complement intermediate signal INB via the inverter I1, wherein INB is the inversion of INA.

The D_latch_2 receives the output Q signal from the D_latch_1 and provides another output Q signal based on the clock input signal CLK that is received at another enable input E. The OR gate receives the output Q signals from the D_latch_1 and the D_latch_2 and provides an output OR signal.

The D_latch_3 receives the output OR signal from the OR gate and provides another output Q signal based on the clock input signal CLK that is received at another inverted enable input E. The AND gate receives the output Q signal from the D_latch_3 and the clock input signal CLK and provides an output AND signal, which is used as the intermediate clock signal OCLK.

The D_latch_4 receives the output Q signal from the D_latch_3 and provides another output Q signal based on the clock input signal CLK that is received at another enable input E. The NAND gate receives the output Q signal from the D_latch_4 and the clock input signal CLK at another inverted input and provides an output NAND signal, which is used as the intermediate clock signal PCLKA. Further, the output Q signal from the D_latch_4 also provides a complement intermediate signal PCLKB via the inverter I2, wherein PCLKB is the inversion of PCLKA.

Figure 3:
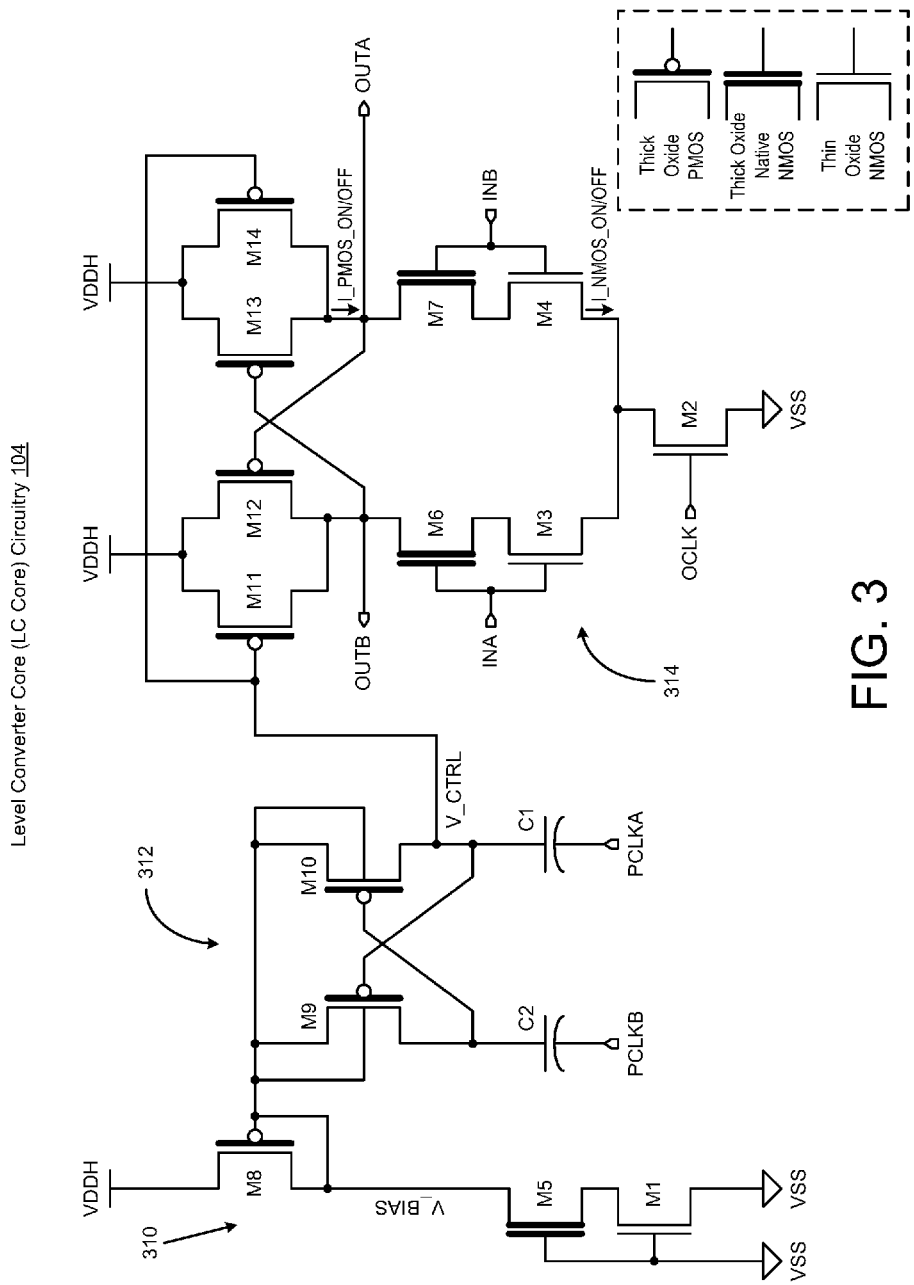
FIG. 3 illustrates a schematic diagram of clock circuitry in accordance with implementations described herein.

FIG. 3 illustrates a schematic diagram of the level converter (LC) core circuitry 104 in accordance with implementations described herein. The level converter (LC) core circuitry 104 in FIG. 3 provides one example schematic implementation of the LC core block 104 of FIG. 1.

As shown in FIG. 3, the level converter (LC) core circuitry 104 may include voltage biasing circuitry 310, voltage control circuitry 312, and voltage output circuitry 314 arranged to receive the high voltage supply VDDH, the first plurality of intermediate signals INA, INB, and the multiple intermediate clock signals OCLK, PCLKA, PCLK2 and provide a second plurality of intermediate signals OUTA, OUTB based on the high voltage supply VDDH, the first plurality of intermediate signals INA, INB, and the multiple intermediate clock signals OCLK, PCLKA, PCLK2. As shown, transistors M1, M5, M8 are arranged in a stack such that transistors M1, M5 are coupled between transistor M8 and ground VSS or GND, and gates of transistors M1, M5 are coupled to ground VSS or GND.

The voltage biasing circuitry 310 may be implemented as current mirror circuitry having a first plurality of transistors M1, M5, M8 arranged to receive the high voltage supply VDDH and provide a biasing voltage V_BIAS based on leakage current from at least one of the first plurality of transistors, such as, e.g., M1 and/or M8. As shown in FIG. 3, the first plurality of transistors M1, M5, M8 may be coupled between the high voltage supply VDDH and ground VSS or GND, and the first plurality of transistors M1, M5, M8 may be arranged to receive the high voltage supply VDDH and provide the biasing voltage V_BIAS based on leakage current from at least one of the first plurality of transistors, such as, e.g., M1 and/or M8.

The voltage biasing circuitry 310 may include multiple transistors including at least one thick oxide PMOS transistor M8, at least one thick oxide native NMOS transistor M5, and at least one thin oxide NMOS transistor M1. As described herein, the first plurality of transistors M1, M5, M8 may be arranged to provide a current mirror that receives the high voltage supply VDDH and provides the biasing voltage V_BIAS based on leakage current from at least one of the first plurality of transistors, such as, e.g., M1 and/or M8.

The voltage control circuitry 312 may include a first pair of cross-coupled transistors M9, M10 and a corresponding pair of coupling capacitors C1, C2 that are arranged to receive the biasing voltage V_BIAS from the voltage biasing circuitry 310 (or the current mirror circuitry) and provide a control voltage V_CTRL based on the biasing voltage V_BIAS to control a pair of pre-charge transistors M11, M14 that are coupled to a second pair of cross-coupled transistors M12, M13. The corresponding pair of coupling capacitors C1, C2 may be coupled between the first pair of cross-coupled transistors M9, M10 and at least two of the multiple intermediate clock signals PCLKA, PCLKB of the clock circuitry 102. In some instances, to ensure that the junction leakage of transistors M9 and M10 does not alter the dc-bias level of V_CTRL, the bodies of transistors M9 and M10 are connected to V_BIAS, while the body of one or more or all other NMOS and PMOS transistors are connected to VDDH and ground VSS or GND.

As shown in FIG. 3, the first pair of cross-coupled transistors M9, M10 and the corresponding pair of coupling capacitors C1, C2 may be arranged to receive the biasing voltage V_BIAS from the voltage biasing circuitry 310 and provide the control voltage V_CTRL based on the biasing voltage V_BIAS to control the pair of pre-charge transistors M11, M14 that are coupled to the second pair of cross-coupled transistors M12, M13. The second pair of cross-coupled transistors M12, M13 may be coupled between the high voltage supply VDDH and a second plurality of transistors M2, M3, M4, M6, M7, and the second plurality of transistors M2, M3, M4, M6, M7 may be coupled between the second pair of cross-coupled transistors M12, M13 and ground VSS or GND.

The level converter (LC) core circuitry 104 may include voltage output circuitry 314 having the second plurality of transistors M2, M3, M4, M6, M7 that are coupled between the second pair of cross-coupled transistors M12, M13 and ground VSS or GND. The second plurality of transistors M2, M3, M4, M6, M7 may be arranged to receive the high voltage supply VDDH from the second pair of cross-coupled transistors M12, M13 and provide voltage output signals OUTA, OUTB (i.e., second plurality of intermediate signals) based on activation of the second pair of cross-coupled transistors M12, M13 with the voltage control signal V_CTRL and based on activation of the second plurality of transistors M2, M3, M4, M6, M7 with multiple activation signals, such as, e.g., the first plurality of intermediate signals INA, INB, and the intermediate clock signal OCLK.

Figure 4:
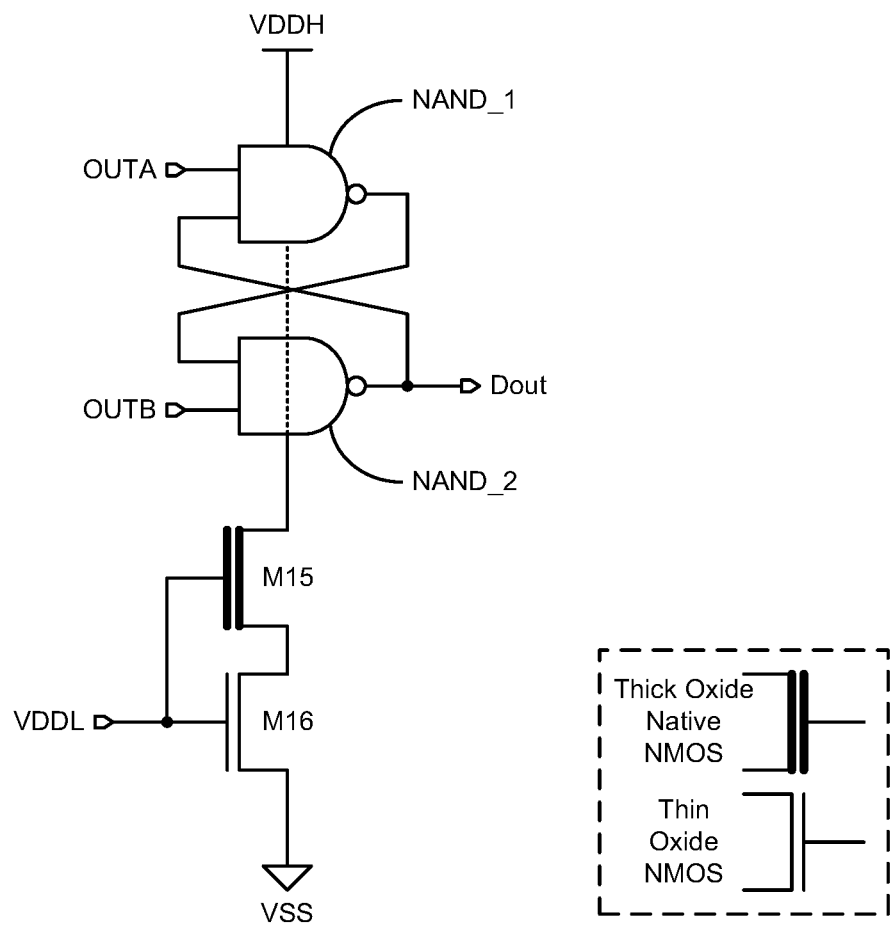
FIG. 4 illustrates a schematic diagram of latch circuitry in accordance with implementations described herein.

FIG. 4 illustrates a schematic diagram of the latch circuitry 106 in accordance with implementations described herein. The latch circuitry 106 in FIG. 4 provides one example schematic implementation of the SR latch block 106 of FIG. 1.

As shown in FIG. 4, the latch circuitry 106 may include a second plurality of logic components arranged to receive the high voltage supply VDDH, the low voltage supply VDDL, and the second plurality of intermediate signals OUTA, OUTB and provide the data output signal Dout based on the high voltage supply VDDH, the low voltage supply VDDL, and the second plurality of intermediate signals OUTA, OUTB.

The latch circuitry 106 may be implemented as set-reset (SR) latch circuitry, and the second plurality of logic components may include multiple logic gates NAND_1, NAND_2 and multiple transistors M15, M16. The multiple logic gates NAND_1, NAND_2 may be coupled between the high voltage supply VDDH and the multiple transistors M15, M16, and the multiple transistors M15, M16 may be coupled between the multiple logic gates NAND_1, NAND_2 and ground VSS or GND. The multiple transistors M15, M16 may be activated and deactivated based on the low voltage supply VDDL.

In some scenarios, the second plurality of logic components may be arranged to receive the high voltage supply VDDH, the low voltage supply VDDL, and the one or more voltage output signals OUTA, OUTB (i.e., second plurality of intermediate signals) from the voltage output circuitry 314 and provide the data output signal Dout based on the high voltage supply VDDH, the low voltage supply VDDL, and the one or more voltage output signals OUTA, OUTB.

As described above, a block diagram of the level converter (LC) 100 is shown in FIG. 1, and its detailed sub-blocks 102, 104, 106 are shown in FIG. 2-3. In the LC core 104, the bias voltage V_BIAS for the pre-charge PMOS transistors M11, M14 is generated by the voltage biasing circuitry 310 (or current mirror), which includes the transistors M1, M5 and M8. Since the leakage current of transistor M1 is the reference, V_BIAS is set to a value at which M8 conducts a same current as M1 leakage. In FIG. 3, using this structure, I_PMOS_OFF and I_NMOS_OFF may remain substantial similar (or equal) across PVT, which may provide a situation where the NMOS and PMOS on-currents may be always larger than the PMOS and NMOS off-currents, respectively. The V_CTRL signal, which may be dc-biased by V_BIAS and has a VDDL voltage down-swing exploiting cross-coupled M9 and M10 with ac-coupling capacitors, turns M11 and M14 on and off. Since M11 and M14 may be biased by V_BIAS during the off-state, i.e., tracking I_NMOS_OFF, M11 and M14 may be turned on with a small VDDL voltage swing despite their large threshold voltage.

Since two complementary outputs, OUTA and OUTB, are both high during pre-charge (when CLK is low), the SR latch 106 may follow the LC core 104 to hold the output during this pre-charge period. To prevent the SR latch 106, i.e., static logic gates, from wasting power during the input transition, the NMOS transistor M16 is biased by VDDL and inserted so that the SR latch output slew rate matches that of the LC core 104.

For the LC core 104 to function as a level-converting flip-flop, a single negative D-latch should precede it. However, due to the pre-charge, the LC core 104 may consume switching power in every clock cycle even if the input does not change. This may degrade energy efficiency in common low data activity scenarios. However, to address this case, the clock-on-demand (COD) circuitry 102 may be incorporated, and pre-charge may thus be avoided in cases where input data does not toggle.

FIG. 5 illustrates a process flow diagram of a method 500 for manufacturing, fabricating, and/or producing an integrated circuit, such as, e.g., level converter circuitry, in accordance with various implementations described herein.

It should be understood that even though method 500 may indicate a particular order of operation execution, various certain portions of the operations may be executed in a different order, and on different systems. In some cases, additional operations and/or steps may be added to and/or omitted from method 500. Further, method 500 may be implemented in hardware and/or software. If implemented in hardware, method 500 may be implemented with various circuit components, as described herein above in reference to FIGS. 1-4. If implemented in software, method 500 may be implemented, e.g., as a program or software instruction process that may be configured for implementing level converter circuitry with bypass control as described herein above. Further, if implemented in software, various instructions related to implementing method 500 may be stored or recorded in various types of memory. For instance, a computer, a server, or various other types of computing devices having a processor and memory may be configured to execute and perform method 500.

In reference to the process diagram of FIG. 5, method 500 may be utilized for manufacturing an integrated circuit that implements the level converter circuitry as described herein in reference to FIGS. 1-4. In some cases, the integrated circuit may be configured to implement a robust synchronous wide-range clocked level converter (LC) for ultra-low power (ULP) SoC devices. By biasing circuitry using NMOS leakage current, the schemes and techniques described herein provide for robust operation across a wide range of low and high voltage supplies, as well as PVT variations.

At block 510, method 500 may fabricate clock circuitry having a first plurality of logic components arranged to receive a low voltage supply, a data input signal and a clock input signal. Also, at block 510, method 500 may fabricate the clock circuitry to provide a first plurality of intermediate signals and multiple intermediate clock signals based on the low voltage supply, the data input signal and the clock input signal. The clock circuitry may include clock-on-demand (COD) circuitry, and the first plurality of logic components may include multiple data latches and multiple logic gates.

At block 520, method 500 may fabricate level converter core circuitry having voltage biasing circuitry and voltage control circuitry arranged to receive a high voltage supply, the first plurality of intermediate signals and the multiple intermediate clock signals. Also, at block 520, method 500 may fabricate the clock circuitry to provide a second plurality of intermediate signals based on the high voltage supply, the first plurality of intermediate signals, and the multiple intermediate clock signals.

The level converter core circuitry may include multiple transistors including multiple thick oxide PMOS transistors, multiple thick oxide native NMOS transistors, and multiple thin oxide NMOS transistors. The voltage biasing circuitry may include current mirror circuitry having a first plurality of transistors arranged to receive the high voltage supply and provide a biasing voltage based on leakage current from at least one of the first plurality of transistors. The voltage control circuitry may include a first pair of cross-coupled transistors and a corresponding pair of coupling capacitors arranged to receive the biasing voltage from the current mirror circuitry and provide a control voltage based on the biasing voltage to control a pair of pre-charge transistors that are coupled to a second pair of cross-coupled transistors. The corresponding pair of coupling capacitors may be coupled between the first pair of cross-coupled transistors and at least two of the multiple intermediate clock signals of the clock circuitry. The second pair of cross-coupled transistors may be coupled between the high voltage supply and a second plurality of transistors, and the second plurality of transistors may be coupled between the second pair of cross-coupled transistors and ground.

At block 530, method 500 may fabricate latch circuitry having a second plurality of logic components arranged to receive the high voltage supply, the low voltage supply and the second plurality of intermediate signals. Also, at block 530, method 500 may fabricate the latch circuitry to provide a data output signal based on the high voltage supply, the low voltage supply, and the second plurality of intermediate signals. The latch circuitry may include set-reset (SR) latch circuitry, and the second plurality of logic components may include multiple logic gates and multiple transistors. The multiple logic gates may be coupled between the high voltage supply and the multiple transistors. The multiple transistors may be coupled between the multiple logic gates and ground. The multiple transistors may be activated and deactivated based on the low voltage supply.

Described herein are various implementations of an integrated circuit. The integrated circuit may include clock circuitry having a first plurality of logic components arranged to receive a low voltage supply, a data input signal and a clock input signal and to provide a first plurality of intermediate signals and multiple intermediate clock signals based on the low voltage supply, the data input signal and the clock input signal. The integrated circuit may include level converter core circuitry having voltage biasing circuitry and voltage control circuitry arranged to receive a high voltage supply, the first plurality of intermediate signals and the multiple intermediate clock signals and to provide a second plurality of intermediate signals based on the high voltage supply, the first plurality of intermediate signals and the multiple intermediate clock signals. The integrated circuit may include latch circuitry having a second plurality of logic components arranged to receive the high voltage supply, the low voltage supply and the second plurality of intermediate signals and to provide a data output signal based on the high voltage supply, the low voltage supply and the second plurality of intermediate signals.

Described herein are various implementations of a level converter. The level converter may include voltage biasing circuitry having a first plurality of transistors coupled between a high voltage supply and ground. The first plurality of transistors may be arranged to receive the high voltage supply and to provide a biasing voltage based on leakage current from at least one of the first plurality of transistors. The level converter may include voltage control circuitry having a first pair of cross-coupled transistors and a corresponding pair of coupling capacitors arranged to receive the biasing voltage from the voltage biasing circuitry and to provide a control voltage based on the biasing voltage to control a pair of pre-charge transistors that are coupled to a second pair of cross-coupled transistors. The level converter may include voltage output circuitry having a second plurality of transistors coupled between the second pair of cross-coupled transistors and ground. The second plurality of transistors may be arranged to receive the high voltage supply from the second pair of cross-coupled transistors and to provide one or more voltage output signals based on activation of the second pair of cross-coupled transistors with the voltage control signal and based on activation of the second plurality of transistors with multiple activation signals.

Described herein are various implementations of a method for manufacturing an integrated circuit. The method may include fabricating clock circuitry having a first plurality of logic components arranged to receive a low voltage supply, a data input signal and a clock input signal and to provide a first plurality of intermediate signals and multiple intermediate clock signals based on the low voltage supply, the data input signal and the clock input signal. The method may include fabricating level converter core circuitry having voltage biasing circuitry and voltage control circuitry arranged to receive a high voltage supply, the first plurality of intermediate signals and the multiple intermediate clock signals and to provide a second plurality of intermediate signals based on the high voltage supply, the first plurality of intermediate signals and the multiple intermediate clock signals. The method may include fabricating latch circuitry having a second plurality of logic components arranged to receive the high voltage supply, the low voltage supply and the second plurality of intermediate signals and to provide a data output signal based on the high voltage supply, the low voltage supply and the second plurality of intermediate signals.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    clock circuitry having a first plurality of logic components arranged to receive a low voltage supply, a data input signal and a clock input signal and to provide a first plurality of intermediate signals and multiple intermediate clock signals based on the low voltage supply, the data input signal and the clock input signal;
    level converter core circuitry having voltage biasing circuitry and voltage control circuitry arranged to receive a high voltage supply, the first plurality of intermediate signals and the multiple intermediate clock signals and to provide a second plurality of intermediate signals based on the high voltage supply, the first plurality of intermediate signals and the multiple intermediate clock signals; and
    latch circuitry having a second plurality of logic components arranged to receive the high voltage supply, the low voltage supply and the second plurality of intermediate signals and to provide a data output signal based on the high voltage supply, the low voltage supply and the second plurality of intermediate signals.

2. The integrated circuit of claim 1, wherein the clock circuitry comprises clock-on-demand (COD) circuitry, and wherein the first plurality of logic components comprises multiple data latches and multiple logic gates.

3. The integrated circuit of claim 1, wherein the level converter core circuitry comprises multiple metal-oxide-semiconductor (MOS) transistors including multiple thick oxide P-type MOS (PMOS) transistors, multiple thick oxide native N-type MOS (NMOS) transistors and multiple thin oxide NMOS transistors.

4. The integrated circuit of claim 1, wherein the voltage biasing circuitry comprises current mirror circuitry having a first plurality of transistors arranged to receive the high voltage supply and to provide a biasing voltage based on leakage current from at least one of the first plurality of transistors.

5. The integrated circuit of claim 4, wherein the voltage control circuitry comprises a first pair of cross-coupled transistors and a corresponding pair of coupling capacitors arranged to receive the biasing voltage from the current mirror circuitry and to provide a control voltage based on the biasing voltage to control a pair of pre-charge transistors that are coupled to a second pair of cross-coupled transistors.

6. The integrated circuit of claim 5, wherein the corresponding pair of coupling capacitors are coupled between the first pair of cross-coupled transistors and at least two of the multiple intermediate clock signals of the clock circuitry.

7. The integrated circuit of claim 5, wherein the second pair of cross-coupled transistors are coupled between the high voltage supply and a second plurality of transistors, and wherein the second plurality of transistors are coupled between the second pair of cross-coupled transistors and ground.

8. The integrated circuit of claim 1, wherein the latch circuitry comprises set-reset (SR) latch circuitry, and wherein the second plurality of logic components comprises multiple logic gates and multiple transistors.

9. The integrated circuit of claim 8, wherein the multiple logic gates are coupled between the high voltage supply and the multiple transistors, and wherein the multiple transistors are coupled between the multiple logic gates and ground, and wherein the multiple transistors are activated and deactivated based on the low voltage supply.

10. A method for manufacturing an integrated circuit, the method comprising:
fabricating clock circuitry having a first plurality of logic components arranged to receive a low voltage supply, a data input signal and a clock input signal and to provide a first plurality of intermediate signals and multiple intermediate clock signals based on the low voltage supply, the data input signal and the clock input signal;
fabricating level converter core circuitry having voltage biasing circuitry and voltage control circuitry arranged to receive a high voltage supply, the first plurality of intermediate signals and the multiple intermediate clock signals and to provide a second plurality of intermediate signals based on the high voltage supply, the first plurality of intermediate signals and the multiple intermediate clock signals; and
fabricating latch circuitry having a second plurality of logic components arranged to receive the high voltage supply, the low voltage supply and the second plurality of intermediate signals and to provide a data output signal based on the high voltage supply, the low voltage supply and the second plurality of intermediate signals.

* * * * *